(12) United States Patent
Rushkin et al.

(10) Patent No.: US 6,929,891 B2
(45) Date of Patent: Aug. 16, 2005

(54) PHOTOSENSITIVE RESIN COMPOSITIONS

(75) Inventors: Ilya Rushkin, Walpole, MA (US); Ahmad A. Naiini, East Greenwich, RI (US); Richard Hopla, Cranston, RI (US); Pamela J. Waterson, Northbridge, MA (US); William D. Weber, Rumford, RI (US)

(73) Assignee: Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 10/795,577

(22) Filed: Mar. 8, 2004

(65) Prior Publication Data

US 2004/0229166 A1 Nov. 18, 2004

Related U.S. Application Data

(60) Provisional application No. 60/453,869, filed on Mar. 11, 2003.

(51) Int. Cl.$^7$ .............................. G03F 7/023; G03F 7/30
(52) U.S. Cl. ...................... 430/18; 430/191; 430/270.1; 430/325; 430/330; 430/906
(58) Field of Search .......................... 430/18, 191, 192, 430/193, 270.1, 325, 330

(56) References Cited

U.S. PATENT DOCUMENTS

| | | | |
|---|---|---|---|
| 3,957,512 A | 5/1976 | Kleeberg et al. | 430/325 |
| 4,040,831 A | 8/1977 | Rubner et al. | 430/325 |
| 4,339,521 A | 7/1982 | Ahne et al. | 430/192 |
| 4,540,598 A | 9/1985 | Berner et al. | 427/518 |
| 4,548,891 A | 10/1985 | Riediker et al. | 430/283.1 |
| 4,703,103 A | 10/1987 | Wolfe et al. | 528/179 |
| 5,233,014 A | 8/1993 | Gregory et al. | 528/185 |
| 5,376,499 A | 12/1994 | Hammerschmidt et al. | 430/192 |
| 5,449,584 A | 9/1995 | Banba et al. | 430/190 |
| 5,486,447 A | 1/1996 | Hammerschmidt et al. | 430/197 |
| 5,512,422 A | 4/1996 | Hanawa et al. | 430/325 |
| 5,726,279 A | 3/1998 | Sezi et al. | 528/310 |
| 5,760,162 A | 6/1998 | Sezi et al. | 528/310 |
| 5,783,654 A | 7/1998 | Sezi et al. | 528/191 |
| 5,807,969 A | 9/1998 | Sezi et al. | 528/310 |
| 5,856,065 A | 1/1999 | Hagen | 430/283.1 |
| 5,922,825 A | 7/1999 | Sezi et al. | 528/191 |
| 5,973,202 A | 10/1999 | Sezi et al. | 564/134 |
| 6,010,825 A | 1/2000 | Hagen et al. | 430/283.1 |
| 6,127,086 A | 10/2000 | Waterson et al. | 430/190 |
| 6,177,225 B1 | 1/2001 | Weber et al. | 430/190 |
| 6,183,934 B1 * | 2/2001 | Kawamonzen | 430/270.1 |
| 6,214,516 B1 | 4/2001 | Waterson et al. | 430/191 |
| 6,277,546 B1 | 8/2001 | Breyta | 430/322 |
| 6,376,151 B1 | 4/2002 | Takahashi et al. | 430/192 |
| 6,436,593 B1 * | 8/2002 | Minegishi et al. | 430/18 |
| 6,485,886 B1 | 11/2002 | Yamato et al. | 430/270.1 |
| 2004/0023147 A1 * | 2/2004 | Hirano et al. | 430/191 |

FOREIGN PATENT DOCUMENTS

| EP | A 0624826 | 7/1997 |
|---|---|---|
| JP | 11-153866 | 6/1999 |
| JP | 2001125267 | 5/2001 |

OTHER PUBLICATIONS

Hinsberg et al., "Influence of Polymer Properties On Airborne Chemical Contamination of Chemically Amplified Resists", SPIE, vol. 1925, pp. 43–52, 1993.

Jan Rabek, Experimental Methods in Polymer Chemistry, John Wiley & Sons, New York, 1983. (This reference is a book).

Asakura et al., "Novel Photoacid Generators For Chemically Amplified Resist With G–Line, I–Line and DUV Exposure", Proceedings of SPIE, vol. 4345 pp. 484–492., 2001.

* cited by examiner

Primary Examiner—John S. Chu
(74) Attorney, Agent, or Firm—Ohlandt, Greeley, Ruggiero & Perle, LLP

(57) ABSTRACT

A heat resistant negative working photosensitive composition that comprises (a) one or more polybenzoxazole precursor polymers (I):

$$G-NH-Ar^4-NH-\overset{O}{\underset{}{C}}-Ar^3-\overset{O}{\underset{}{C}}-NH-Ar^1\overset{OH}{\underset{OH}{|}}$$

$$-(NH)_x-\overset{O}{\underset{}{C}}-Ar^3-\overset{O}{\underset{}{C}}-NH-Ar^2-(NH)_y-G$$

wherein x is an integer from about 10 to about 1000, y is an integer from 0 to about 900 and (x+y) is about less then 1000; $Ar^1$ is selected from the group consisting of a tetravalent aromatic group, a tetravalent heterocyclic group, or mixtures thereof; $Ar^2$ is selected from the group consisting a divalent aromatic, a divalent heterocyclic, a divalent alicyclic, a divalent aliphatic group that may contain silicon, or mixtures thereof; $Ar^3$ is selected from the group consisting a divalent aromatic group, a divalent aliphatic group, a divalent heterocyclic group, or mixtures thereof; $Ar^4$ is selected from the group consisting $Ar^1$ (OH)$_2$ or $Ar^2$; G is an organic group selected from the group consisting groups having a carbonyl, carbonyloxy or sulfonyl group attached directly to the terminal NH group of the polymer;

(b) one or more photo-active compounds which release acid upon irradiation (PAGs);

(c) a latent crosslinker which contains at least two ~N—(CH$_2$OR)$_n$ units wherein n=1 or 2 and R is a linear or branched $C_1$–$C_8$ alkyl group, with the proviso that when a glycoluril is employed as the latent crosslinker, the G group in the polybenzoxazole precursor polymer is produced from the reaction of a cyclic anhydride; and (d) at least one solvent that is not NMP.

61 Claims, No Drawings

PHOTOSENSITIVE RESIN COMPOSITIONS

RELATED APPLICATIONS

This application claims priority from U.S. Provisional Patent Application No. 60/453,869 filed Mar. 11, 2003.

FIELD OF THE INVENTION

The present invention relates to negative photosensitive resin compositions. More specifically, the present invention relates to negative-working, chemically amplified, aqueous base developable photosensitive polybenzoxazole (PBO) precursor compositions that are suitable for applications in the field of microelectronics.

BACKGROUND OF THE INVENTION

In microelectronic applications, polymers that demonstrate high temperature resistance are generally well known. Precursors of such polymers, such as polyimide precursor polymers and polybenzoxazole precursor polymers can be made photoreactive with suitable additives. The precursors are converted to the desired polymer by known techniques such as exposure to high temperatures. The polymer precursors are used to prepare protective layers, insulating layers, and relief structures of highly heat-resistant polymers.

Negative photosensitive resist compositions containing high temperature resistant polymers have been disclosed in, for example, in German patent documents, DE-A-2,308, 830 and DE-A-2-2,437,348; European patent documents EP-A-0 119,162 and EP-A-0 624,826, and U.S. Pat. Nos. 5,486,447, 5,856,065 and 6,010,825. The polyamide resist resin in these disclosures contained pendant olefinic groups, which can be crosslinked upon action of irradiation of suitable wavelength, thus forming a negative pattern. While these systems had good imaging properties, such as high sensitivity, high contrast, low unexposed film loss, some of them, such as those in DE-A 2,437,348; EP-A-0 119,162, or EP-A-0 624,826 employed organic solvents as developers, which creates environmental concerns during device manufacture.

Furthermore, the prior art photosensitive compositions containing high temperature resistant polymers used NMP (N-Methyl-2-pyrrolidone) as a solvent. Since it has been established that NMP has detrimental effects on the performance of chemically amplified 248 and 193 nm photoresists (U.S. Pat. No. 6,277,546 B1; "Influence of Polymer Properties On Airborne Chemical Contamination of Chemically Amplified Resists", W. D, Hinsberg, S. A. MacDonald, N. J. Clecak, C. D. Snyder, and H. Ito, SPIE vol. 1925, pp. 43–52, 1993), use of NMP-containing compositions is prohibited in many semiconductor fabrication facilities where such chemically amplified resists are used.

There are examples in the literature of positive working photosensitive formulations of highly heat-resistant polymer precursors, which contain no NMP and developable in alkaline developer, such as in U.S. Nos. 4,339,521, 5,449, 584, 6,127,086, 6,177,225 B1, and 6,214,516 B1. While these inventions address the environmental concerns they sometimes exhibits inferior imaging properties such as low contrast and somewhat high dark erosion.

The purpose of this invention is to provide a negative working photosensitive composition suitable for making high temperature resistant patterns, which would have excellent imaging properties, contain no NMP and employ environmentally acceptable aqueous base solutions as developer.

BRIEF SUMMARY OF THE INVENTION

The present invention relates to a heat resistant negative working photosensitive composition that comprises (a) one or more polybenzoxazole precursor polymers (I):

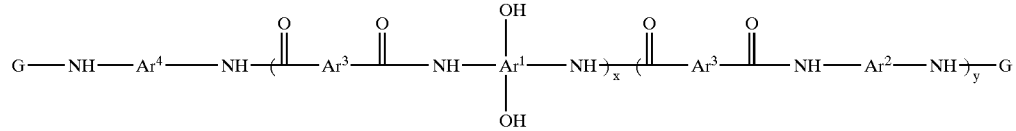

wherein x is an integer from about 10 to about 1000, y is an integer from 0 to about 900 and (x+y) is about less then 1000; $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group, a divalent aliphatic group, a divalent heterocyclic group, or mixtures thereof; $Ar^4$ can be $Ar^1$ $(OH)_2$ or $Ar^2$; G is an organic group having a carbonyl, carbonyloxy or sulfonyl group attached directly to the terminal NH of the polymer;

(b) one or more photo-active compounds which release acid upon irradiation (PAGs);

(c) a latent crosslinker which contains at least two ~N—$(CH_2OR)_n$ units, wherein n=1 or 2 and R is a linear or branched $C_1$–$C_8$ alkyl group, with the proviso that when a glycoluril is employed as the latent crosslinker, the G group of the polybenzoxazole precursor polymer is produced from the reaction of a cyclic anhydride; and (d) at least one solvent that is not NMP.

Furthermore, the invention comprises a method of use for such compositions and the articles of manufacture, particularly electronic parts, obtained by the combination of the composition and the method of use according to the invention. The invention comprises a process for forming a negative tone relief image on a substrate. The process comprises the steps of:

(a) providing a substrate, (b) coating on said substrate a negative-working photosensitive composition comprising one or more polybenzoxazole precursors having the structure (I),

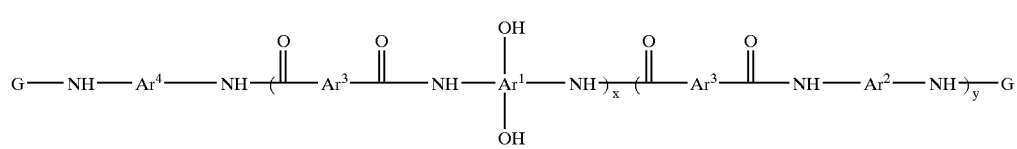

(I)

wherein $Ar^1$, $Ar^2$, $Ar^3$, and G are as defined above; one or more photo-active compounds which release acid upon irradiation, a latent crosslinker which contains at least two ~N—$(CH_2OR)_n$ units, wherein n=1 or 2 and R is a linear or branched $C_1$–$C_8$ alkyl group, with the proviso that when a glycoluril is employed as the latent crosslinker, the G group of the polybenzoxazole precursor polymer is produced from the reaction of a cyclic anhydride; and at least one solvent that is not NMP, thereby forming a coated substrate;

(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

DETAILED DESCRIPTION OF THE INVENTION

The present invention relates to a heat resistant negative working photosensitive composition that comprises
(a) one or more polybenzoxazole precursor polymers (I):

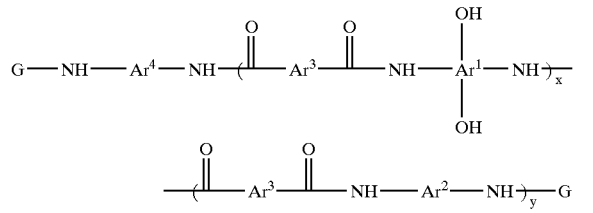

wherein x is an integer from about 10 to about 1000, y is an integer from 0 to about 900 and (x+y) is less than about 1000; $Ar^1$ is a tetravalent aromatic group, a tetravalent heterocyclic group, or mixtures thereof; $Ar^2$ is a divalent aromatic, a divalent heterocyclic, a divalent alicyclic, or a divalent aliphatic group that may contain silicon or mixtures thereof; $Ar^3$ is a divalent aromatic group, a divalent aliphatic group, a divalent heterocyclic group, or mixtures thereof; $Ar^4$ can be $Ar^1$ $(OH)_2$ or $Ar^2$; G is an organic group having a carbonyl, carbonyloxy or sulfonyl group bonded directly to the terminal NH of the polymer;
(b) one or more photo-active compounds which release acid upon irradiation (PAGs);
(c) a latent crosslinker which contains at least two ~N—$(CH_2OR)_n$ units, wherein n=1 or 2 and R is a linear or branched $C_1$–$C_8$ alkyl group, with the proviso that when a glycoluril is employed as the latent crosslinker, the G group of the polybenzoxazole precursor polymer is produced from the reaction of a cyclic anhydride; and
(d) and at least one solvent that is not NMP.

The negative photosensitive resin composition has one or more polybenzoxazole precursors comprising the structure shown in (I). In Structure I, $Ar^1$ is a tetravalent aromatic group or a tetravalent heterocyclic group, or mixtures thereof. Examples of $Ar^1$ include, but are not limited to, the following structures:

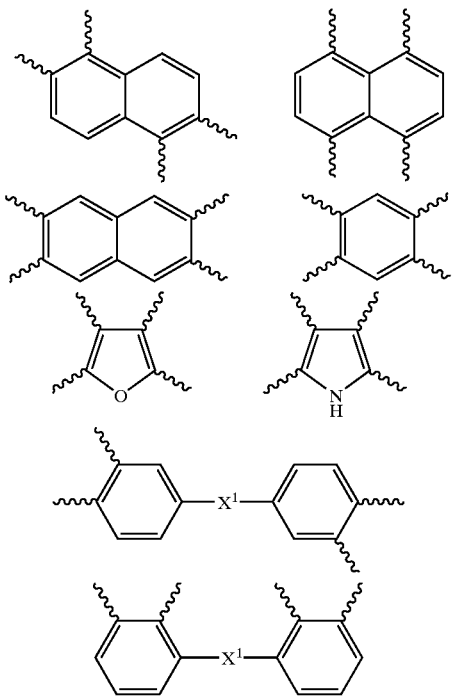

wherein $X^1$ is —O—, —S—, —C$(CF_3)_2$—, —CH$_2$—, —SO$_2$—, —NHCO— or —SiR$^1_2$— and each $R^1$ is independently a $C_1$–$C_7$ linear or branched alkyl or a $C_5$–$C_8$ cycloalkyl group. Examples of $R^1$ include, but are not limited to, —$CH_3$, —$C_2H_5$, n-$C_3H_7$, i-$C_3H_7$, n-$C_4H_9$, t-$C_4H_9$, and cyclohexyl. A mixture of two or more $Ar^1$ groups may be employed.

In Structure I, $Ar^2$ is a divalent aromatic, a divalent heterocyclic, a divalent alicyclic, or a divalent aliphatic group that may contain silicon. Examples of $Ar^2$ include but are not limited to

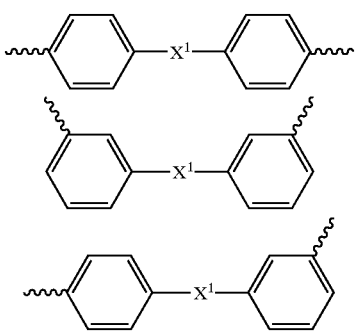

-continued

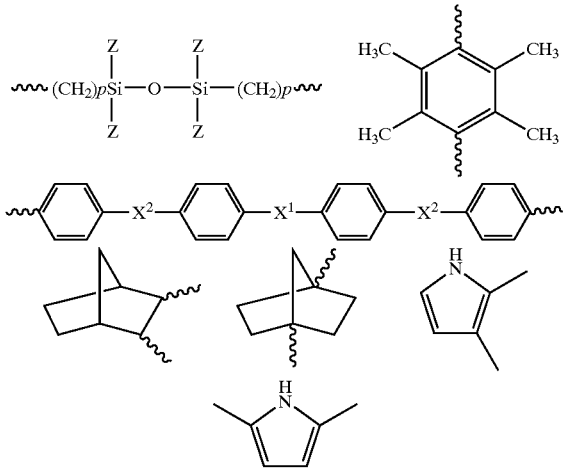

wherein X¹ is as defined before, X² is —O—, —S—, —C(CF$_3$)$_2$—, —CH$_2$—, —SO$_2$—, or —NHCO—, Z=H or C$_1$–C$_8$ linear, branched or cyclic alkyl and p is an integer from 1 to 6. Examples of suitable Z groups include, but are not limited to, methyl, ethyl, propyl, isopropyl, n-butyl, sec-butyl, t-butyl, n-octyl, cyclopentyl, cyclohexyl or cyclooctyl.

Ar³ is a divalent aromatic, a divalent aliphatic, or a divalent heterocyclic group. Examples of Ar³ include but are not limited to:

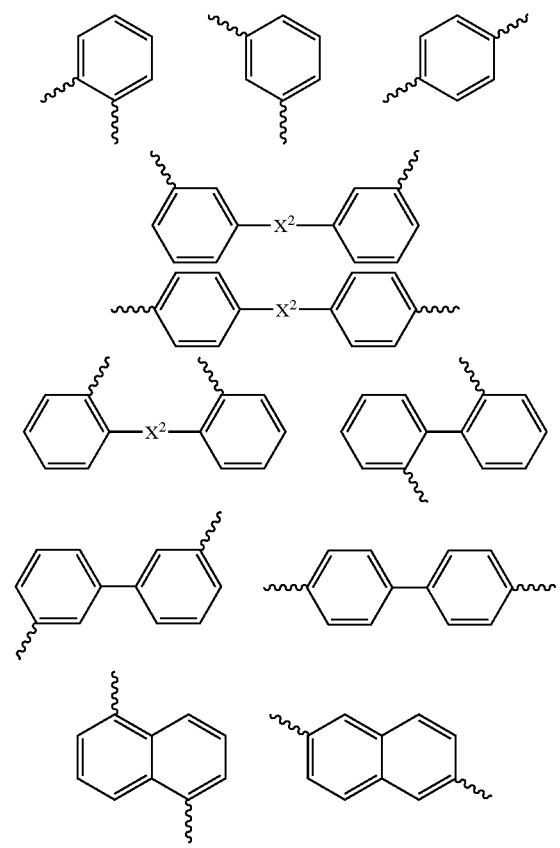

In Structure I, Ar⁴ is Ar¹ (OH)$_2$ or Ar².

G is an organic group having a carbonyl, carbonyloxy or sulfonyl group attached directly to the terminal NH group of the polymer, which may be further substituted by other functional groups such as vinyl, carbonyl, ether ester, or carboxylic acids. Examples of G groups include, but are not limited to, the following structures:

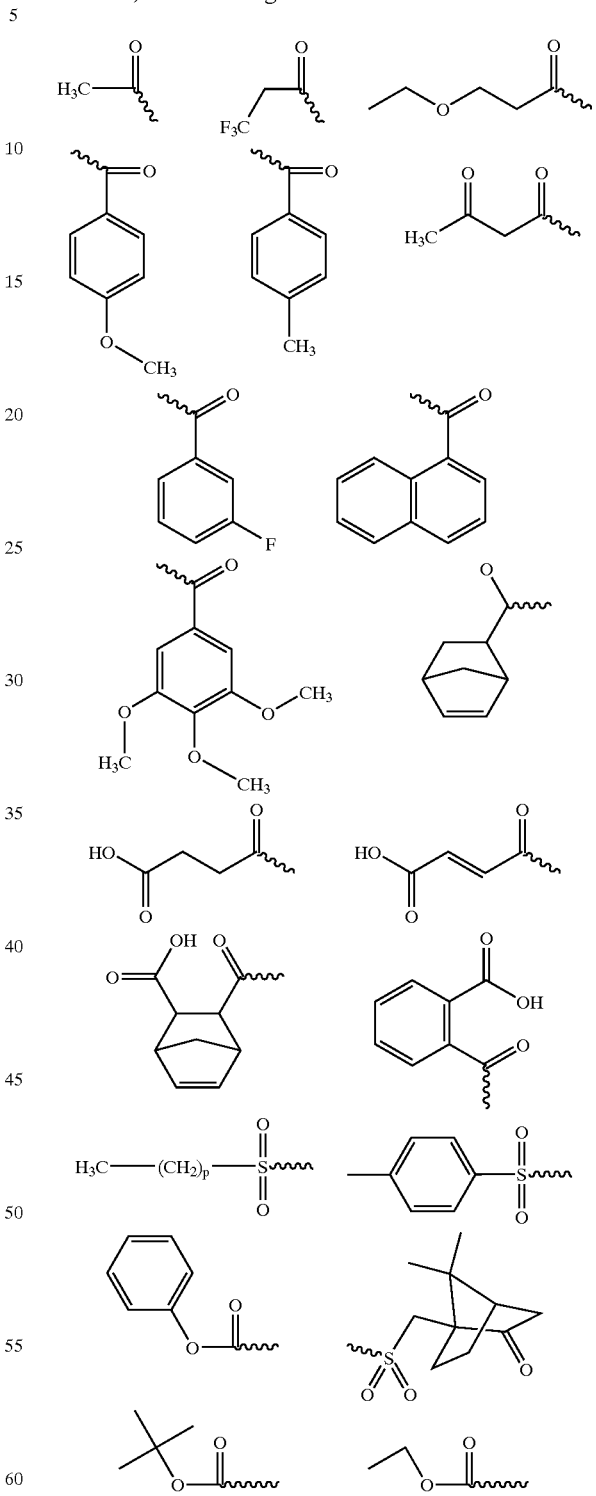

Polybenzoxazole precursor polymers of Structure I are synthesized by a two-step synthesis. In the first step, monomers having Structures (II), (III), and (IV) are reacted in the presence of a base to synthesize a polybenzoxazole precursor base polymer having Structure V.

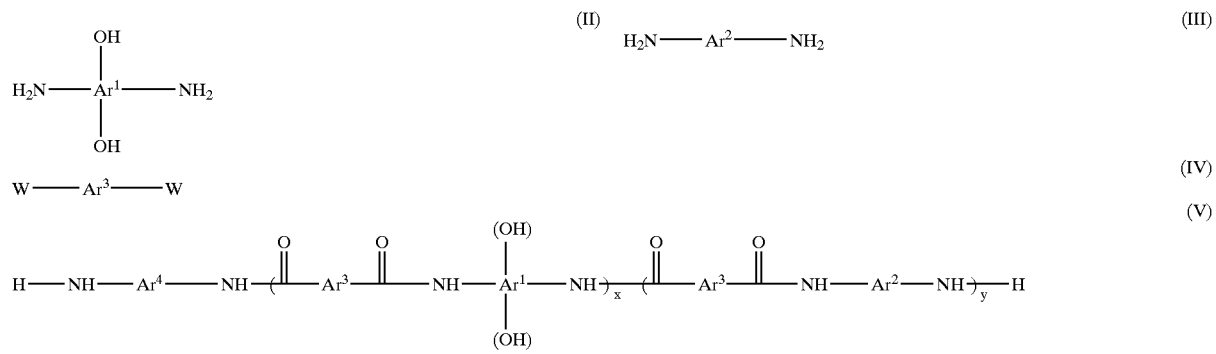

wherein $Ar^1$, $Ar^2$, $Ar^3$, x, and y are as previously defined, and W is C(O)Cl, COOH or $COOR^2$ and wherein $R^2$ is a $C_1$–$C_7$ linear or branched alkyl group or a $C_5$–$C_8$ cycloalkyl group. Examples of $R^2$ include, but are not limited to, $CH_3$, $C_2H_5$, n-$C_3H_7$, i-$C_3H_7$, n-$C_4H_9$, t-$C_4H_9$, and cyclohexyl. In the second synthesis step, the terminal amino groups of the polybenzoxazole precursor base polymer are reacted with a compound G-M, where G is as described before and M is a reactive group, to produce a polymer having Structure I.

Examples of monomers having the Structure (II) containing $Ar^1$ include but are not limited to 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl) propane. The substitution pattern of the two hydroxy and two amino groups in the monomer of Structure II may be any of the possible substitution patterns with the proviso that each amino group has an ortho relationship with a hydroxyl group in order to be able to form the benzoxaxole ring. Furthermore, the polybenzoxazole precursor base polymer may be synthesized using a mixture of two or more monomers described by Structure II.

Examples of monomers having the Structure (III) containing $Ar^2$ include, but are not limited to, 5(6)-amino-1-(4-aminophenyl)-1,3,3-trimethylindane (DAPI), m-phenylenediamine, p-phenylenediamine, 2,2'-bis (trifluoromethyl)-4,4'-diamino-1,1'-biphenyl, 3,4'-diaminodiphenyl ether, 4,4'-diaminodiphenyl ether, 3,3'-diaminodiphenyl ether, 2,4-tolylenediamine, 3,3'-diaminodiphenyl sulfone, 3,4'-diaminodiphenyl sulfone, 4,4'-diaminodiphenyl sulfone, 3,3'-diaminodiphenylmethane, 4,4'-diaminodiphenylmethane, 3,3'-diaminodiphenylmethane, 3,4'-diaminodiphenylmethane, 4,4'-diaminodiphenyl ketone, 3,3'-diaminodiphenyl ketone, 3,4'-diaminodiphenyl ketone, 1,3-bis(4-aminophenoxy) benzene, 1,3-bis(3-amino-phenoxy) benzene, 1,4-bis(γ-aminopropyl)tetramethyldisiloxane, 2,3, 5,6-tetramethyl-p-phenylenediamine, m-xylylenediamine, p-xylylenediamine, methylenediamine, tetramethylenediamine, pentamethylenediamine, hexamethylenediamine, 2,5-dimethylhexamethyl-enediamine, 3-methoxyhexamethylenediamine, heptamethylenediamine, 2,5-dimethylheptamethyl-enediamine, 3-methylheptamethylenediamine, 4,4-dimethylheptamethylenediamine, octamethylenediamine, nonamethylenediamine, 2,5-dimethylnonamethyl-enediamine, decamethylenediamine, ethylenediamine, propylenediamine, 2,2-dimethylpropylenediamine, 1,10-diamino-1,10-dimethyldecane, 2,11-diaminidodecane, 1,12-diaminooctadecane, 2,17-diaminoeicosane, 3,3'-dimethyl-4,4'-diaminodiphenylmethane, bis(4-aminocyclohexyl) methane, bis(3-aminonorbornyl)methane, 3,3'-diaminodiphenylethane, 4,4'-diaminodiphenylethane, and 4,4'-diaminodiphenyl sulfide, 2,6-diaminopyridine, 2,5-diaminopyridine, 2,6-diamino-4-trifluoromethylpyridine, 2,5-diamino-1,3,4-oxadiazole, 1,4-diaminocyclohexane, piperazine, 4,4'-methylenedianiline, 4,4'-methylene-bis(o-choloroaniline), 4,4'-methylene-bis(3-methylaniline), 4,4'-methylene-bis(2-ethylaniline), 4,4'-methylene-bis(2-methoxyaniline), 4,4'-oxy-dianiline, 4,4'-oxy-bis-(2-methoxyaniline), 4,4'-oxy-bis-(2-chloroaniline), 4,4'-thio-dianiline, 4,4'-thio-bis-(2-methylaniline), 4,4'-thio-bis-(2-methyoxyaniline), 4,4'-thio-bis-(2-chloroaniline), 3,3'-sulfonyl-dianiline, and 3,3'-sulfonyl-dianiline. Furthermore, the polybenzoxazole precursor base polymer may be synthesized using a mixture of two or more monomers described by Structure III.

Monomers having the Structure IV are diacids, diacid dichlorides and diesters. Examples of suitable dicarboxylic acids (W=COOH) include, but are not limited to, 4,4'-diphenyletherdicarboxylic acid, terephthalic acid, isophthalic acid and mixtures thereof. Examples of suitable diacid chlorides (W=COCl) include, but are not limited to, isophthaloyl dichloride, phthaloyl dichloride, terphthaloyl dichloride, 4,4'-diphenyletherdicarboxylic acid dichloride, and mixtures thereof. Examples of suitable dicarboxylic esters (W=$CO_2R^2$) include but are not limited to: dimethylisophthalate, dimethylphthalate, dimethylterphthalate, diethylisophthalate, diethylphthalate, diethylterphthalate and mixtures thereof.

In the first synthetic step monomers having Structures (II) and (III) and (IV) can react to produce polybenzoxazole precursor base polymer (V). Any conventional method for reacting a dicarboxylic acid or its dichloride or diester with at least one aromatic and/or heterocyclic dihydroxydiamine, and optionally, with at least one diamine, may be used. Generally, the reaction for diacids (W=C(O)Cl) is carried out at about −10° C. to about 30° C. for about 6 to about 48 hours in the presence of an approximately stoichiometric amount of amine base. Examples of suitable amine bases include, but are not limited to pyridine, triethyl amine, 1,8-diazabicyclo[5.4.0]undec-7-ene (DBU), 1,5-diazabicyclo[4.3.0]non-5-ene (DBN), dimethyl pyridine, and dimethylaniline. The polybenzoxazole precursor base polymer V may be isolated by precipitation into water, recovered by filtration and dried. Descriptions of suitable syntheses employing diesters or diacids may be found in U.S. Pat. Nos. 4,395,482, 4,622,285, and 5,096,999, herein incorporated by reference.

The preferred reaction solvents are N-methyl-2-pyrrolidone (NMP), gamma-butyrolactone (GBL), N,N- dimethylformamide (DMF), N,N-dimethylacetamide (DMAc), dimethyl-2-piperidone, dimethylsulfoxide (DMSO), sulfolane, and diglyme. The most preferred solvents are N-methyl-2-pyrrolidone (NMP) and gamma-butyrolactone (GBL).

Monomers having structure II, III, and IV are employed such that the ratio of [(II)+(III)]/(IV) is generally from about 1 to about 1.2. Preferably, the ratio of [(II)+(III)]/(IV) is generally from about 1 to about 1.1. The monomer having the Structure (II) is employed from about 10 to about 100 mole % of [(II)+(III)] and the monomer having Structure (III) is employed from about 0 to about 90 mole % of [(II)+(III)]. Distribution of the polymeric units resulting from monomers having the Structures II and III in the polybenzoxazole precursor base polymer (enclosed in brackets in Structures I and V), may be random or in blocks within it.

In Structures I and V, x is an integer from about 10 to about 1000, y is an integer from about 0 to about 900 and (x+y) is about less then 1000. A preferred range for x is from about 10 to about 300 and a preferred range for y is from about 0 to about 250. A more preferred range for x is from about 10 to about 100 and a more preferred range for y is from about 0 to about 100. The most preferred range for x is from about 10 to about 50 and a most preferred range for y is from about 0 to about 5.

The amount of (x+y) can be calculated by dividing the numeric average molecular weight (Mn) of a polymer of Structure I by the average molecular weight of the repeat unit. The value of Mn can be determined by such standard methods as membrane osmometry or gel permeation chromatography as described, for example, in Jan Rabek, Experimental Methods in Polymer Chemistry, John Wiley&Sons, New York, 1983.

It should be noted that molecular weight and inherent viscosity of the polymers and therefore, x and y at a constant stoichiometry, can have a wide range depend on the reaction conditions such as the purity of the solvent, the humidity, presence or absence of a blanket of nitrogen or argon gas, reaction temperature, reaction time, and other variables.

In the second synthesis step, polybenzoxazole base polymer (V) is reacted with G-M to produce the polybenzoxazole precursor polymer (I) where G is as described before and M is a reactive leaving group. Examples of M groups include, but are not limited to, Cl, Br, mesylate, triflate, substituted carbonyloxy groups, and substituted carbonate groups. Examples of suitable classes of G-M compounds includes but are not limited to carboxylic and sulfonic acid chlorides, carboxylic and sulfonic acid bromides, linear and cyclic carboxylic and sulfonic acid anhydrides, and alkoxy or aryloxy substituted acid chlorides. Examples of suitable G-M compounds include maleic anhydride, succinic anhydride, acetic anhydride, propionic anhydride, norbornene anhydride, phthalic anhydride, camphor sulfonic acid anhydride, trifluoromethane sulfonic acid anhydride, methanesulfonic acid anhydride, p-toluenesulfonic acid anhydride, ethanesulfonic acid anhydride, butanesulfonic acid anhydride, perfluorobutanesulfonic acid anhydride, acetyl chloride, methanesulfonyl chloride, trifluoromethanesulfonyl chloride, benzoyl chloride, norbornene carboxylic acid chloride, di-t-butyl dicarbonate, dimethyl dicarbonate, diethyldicarbonate, dibutyldicarbonate, t-butyl chloroformate, ethyl chloroformate, n-butyl chloroformate, and methyl chloroformate. Further examples include compounds having the structures shown below. Preferred G are those obtained by reaction of the terminal $NH_2$ group of the polymer with an alkyl carboxylic acid chloride, a linear carboxylic acid anhydride (either one yielding G=alkylcarbonyl) or a cyclic anhydride.

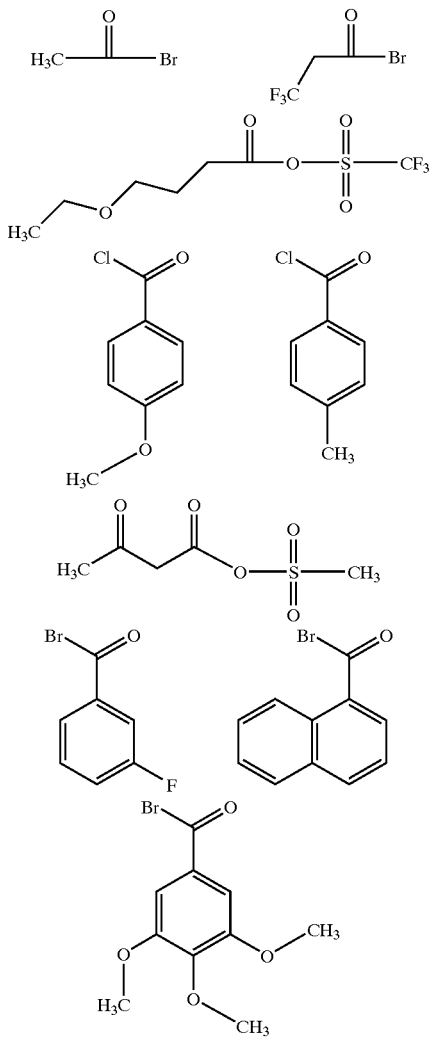

The reaction can be carried out in a suitable solvent by addition of G-M to a dry solution of the polybenzoxazole precursor base polymer at a temperature from about −25° C. to about 40° C. The more preferred temperature is from about 0° C. to about 25° C. The most preferred temperature is from about 5° C. to about 10° C. The reaction time is from about 1 hour to about 24 hours. The molar amount of GM employed is a slight excess (3–6%) of the sum of the molar amounts of monomer of structures II and III less the molar amount of monomer of structure IV. Addition of organic or inorganic base may also be employed. Examples of suitable organic amine bases include, but are not limited to pyridine, triethyl amine, 1,8-diazabicyclo[5.4.0]undec-7-ene (DBU), 1,5-diazabicyclo[4.3.0]non-5-ene (DBN), dimethyl pyridine, and dimethylaniline. Examples of other suitable bases include sodium hydroxide, sodium carbonate, and sodium silicate.

The preferred reaction solvents are propylene glycol methyl ether acetate (PGMEA), N-methyl-2-pyrrolidone (NMP), gamma-butyrolactone (GBL), N,N-dimethylformamide (DMF), N,N-dimethylacetamide (DMAc), dimethyl-2-piperidone, dimethylsulfoxide (DMSO), tetrahydrofuran (THF), acetone, sulfolane, and diglyme. The most preferred solvents are diglyme and PGMEA.

The negative-working formulation of the present invention uses photo-active compounds which release acid upon irradiation. Such materials are commonly called Photo-Acid Generators (PAGs). PAGs of the present invention are active to the radiation between about 300 nm to about 460 nm. They should form a homogeneous solution in the photosensitive composition and produce strong acid upon irradiation. Examples of such acids include hydrogen halides or a sulfonic acid. The classes of such PAGs include, but are not limited to, oxime sulfonates, halomethyl triazides, diazoquinone sulfonates, or sulfonium or idonium salts of sulfonic acids. Examples of suitable PAGs include but are not limited to:

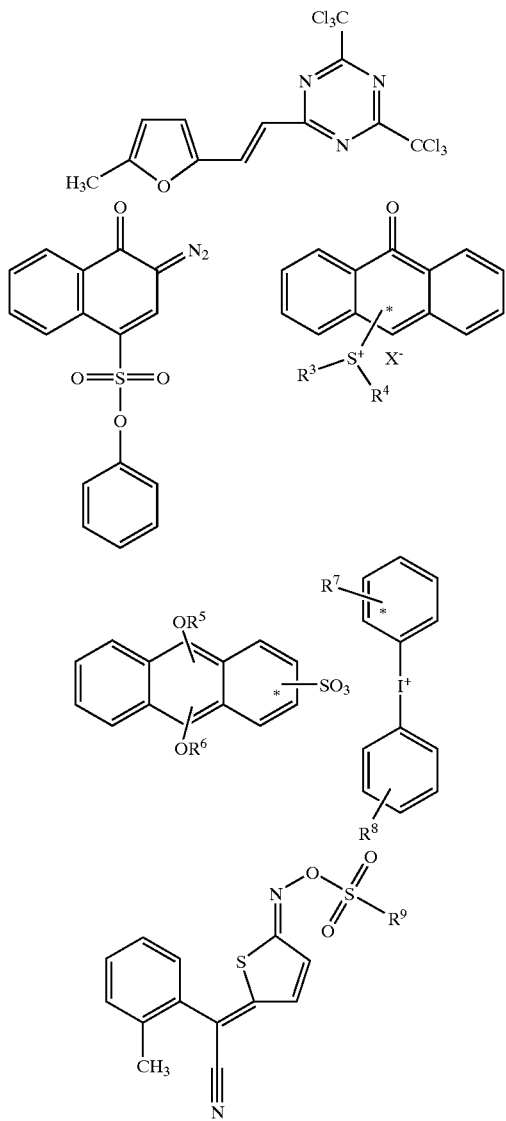

where $R^3$ and $R^4$ are each independently linear, branched or cyclic alkyl or aryl group containing 1 to 20 carbon atoms and $X^-$ is $R^{10}SO_3^-$ ($R^{10}$ is a substituted or unsubstituted, linear, branched or cyclic $C_1$–$C_{25}$ alkyl or an single or multinuclear aryl group having a total of from 6 to 25 carbons; $R^5$, $R^6$, $R^7$ and $R^8$ are independently linear, branched or cyclic alkyl groups and $R^9$ is a linear or branched $C_1$–$C_8$ alkyl, $C_5$–$C_8$ cycloalkyl, camphoroyl or toluyl.

Alternatively, acid could be generated by a combination of a PAG and a sensitizer. In such systems energy of radiation is absorbed by the sensitizer and transmitted in some manner to the PAG. The transmitted energy causes PAG decomposition and generation of photoacid. Any suitable photoacid generator compound may be used. Suitable classes of photoacid generators generating sulfonic acids include, but are not limited to, sulfonium or iodonium salts, oximidosulfonates, bissulfonyldiazomethane compounds, and nitrobenzylsulfonate esters. Suitable photoacid generator compounds are disclosed, for example, in U.S. Pat. Nos. 5,558,978 and 5,468,589, which are incorporated herein by reference. Other suitable photoacid generators are perfluoroalkyl sulfonyl methides and perfluoroalkyl sulfonyl imides as disclosed in U.S. Pat. No. 5,554,664.

Still other suitable examples of photoacid generators are triphenylsulfonium bromide, triphenylsulfonium chloride, triphenylsulfonium iodide, triphenylsulfonium hexafluorophosphate, triphenylsulfonium hexafluoroarsenate, triphenylsulfonium hexafluoroarsenate, triphenylsulfonium trifluoromethanesulfonate, diphenylethylsulfonium chloride, phenacyldimethylsulfonium chloride, phenacyltetrahydrothiophenium chloride, 4-nitrophenacyltetrahydrothiopheniumn chloride, and 4-hydroxy-2-methylphenylhexahydrothiopyrylium chloride.

Additional examples of suitable photoacid generators for use in this invention include triphenylsulfonium perfluorooctanesulfonate, triphenylsulfonium perfluorobutanesulfonate, methylphenyldiphenylsulfonium perfluorooctanesulfonate, methylphenyldiphenysulfonium perfluorooctanesulfonate, 4-n-butoxyphenyldiphenyl- sulfonium perfluorobutanesulfonate, 2,4,6-trimethylphenyldiphenylsulfonium perfluorobutanesulfonate, 2,4,6-trimethylphenyldiphenylsulfonium benzenesulfonate, 2,4,6-trimethylphenyldiphenylsulfonium, 2,4,6-triisopropylbenzenesulfonate, phenylthiophenyldiphenylsulfonium 4-dodecylbenzensulfonic acid, tris(-t-butylphenyl)sulfonium perfluorooctanesulfonate, tris(-t-butylphenyl)sulfonium perfluorobutanesulfonate, tris(-t-butylphenyl)sulfonium 2,4,6-triisopropylbenzenesulfonate, tris(-t-butylphenyl)sulfonium benzenesulfonate, and phenylthiophenyldiphenylsulfonium perfluorooctanesulfonate.

Examples of suitable iodonium salts for use in this invention include, but are not limited to, diphenyl iodonium perfluorobutanesulfonate, bis-(t-butylphenyl)iodonium perfluorobutanesulfonate, bis-(t-butylphenyl)iodonium perfluorooctanesulfonate, diphenyl iodonium perfluorooctanesulfonate, bis-(t-butylphenyl)iodonium benzenesulfonate, bis-(t-butylphenyl)iodonium 2,4,6-triisopropylbenzenesulfonate, and diphenyliodonium 4-methoxybenzensulfonate.

Further examples of suitable photoacid generators for use in this invention are bis(p-toluenesulfonyl)diazomethane, methylsulfonyl p-toluenesulfonyldiazomethane, 1-cyclohexylsulfonyl-1-(1,1-dimethylethylsulfonyl)diazometane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfony1)propiophenone, 2-methanesulfonyl-2-methyl-(4-methylthiopropiophenone, 2,4-methy1-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1 cyclohexylcarbonyldiazomethane, 1-diazo-1-cyclohexylsulfonyl-3,3-dimethyl-2-butanone, 1-diazo-1-(1, 1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, and 2,4-dinitrobenzyl p-trifluoromethylbenzenesulfonate.

Examples of sensitizers include but are not limited to: 9-methylanthracene, anthracenemethanol, acenaththalene, thioxanthone, methyl-2-naphthyl ketone, 4-acetylbiphenyl, 1,2-benzofluorene.

The latent crosslinker of this invention should contain at least two —N—(CH$_2$—OR)$_n$, units wherein n=1 or 2. When such structure interacts with an acid, formed after PAG irradiation, a carbocation is believed to be formed U.S. Pat. No. 5,512,422):

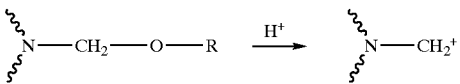

The carbocation formed from the crosslinker can then react with an OH group in a polymer chain or undergo a Friedel Crafts reaction with an aromatic ring. Reaction of two or more such sites of the crosslinker with two or more polymer chains results in crosslinks as shown in the scheme below for R=Me. The crosslinks render the polymer less soluble in developer and creates the solubility differential with the unexposed areas necessary for image formation. Enough crosslinkers render it insoluble.

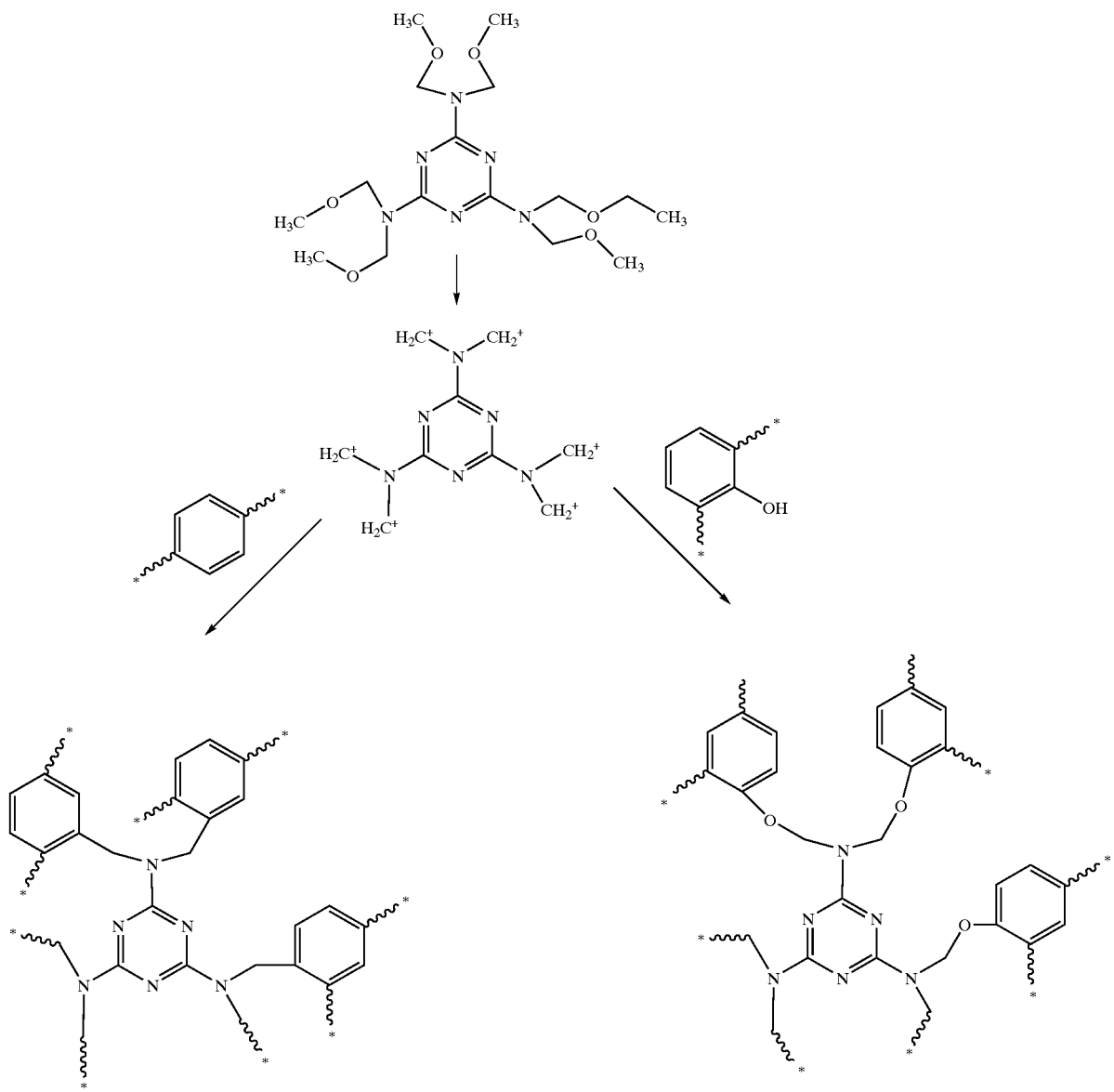

The latent crosslinker of this invention may be a single compound, an oligomer, a polymer, or mixtures thereof each containing at least two —N(CH$_2$OR)$_n$ groups. Such crosslinking agents may be prepared by the reaction of a variety of polyamino compounds with formaldehyde in the presence of alcohols such as methanol or butanol or in other solvents followed by an etherification step. Examples of suitable polyamino compounds include urea, melamine, benzoguanamine, glyouril, diguanamines, as described in U.S. Pat. No. 5,545,702, and guanidine.

Examples of suitable classes of such latent crosslinkers include but are not limited to the alkoxymethylmelamines, the alkoxyamethylglycolurils, the alkoxymethylbenzoguanamines, the alkoxymethyldiguanamines derived from diguanamines as described in U.S. Pat. No. 5,545,702, and melamine or benzoguanamine polymers as described in U.S. Pat. No. 6,524,708. Specific examples of compounds having multiple —N—(CH$_2$—OR)$_n$ units include but are not limited to:

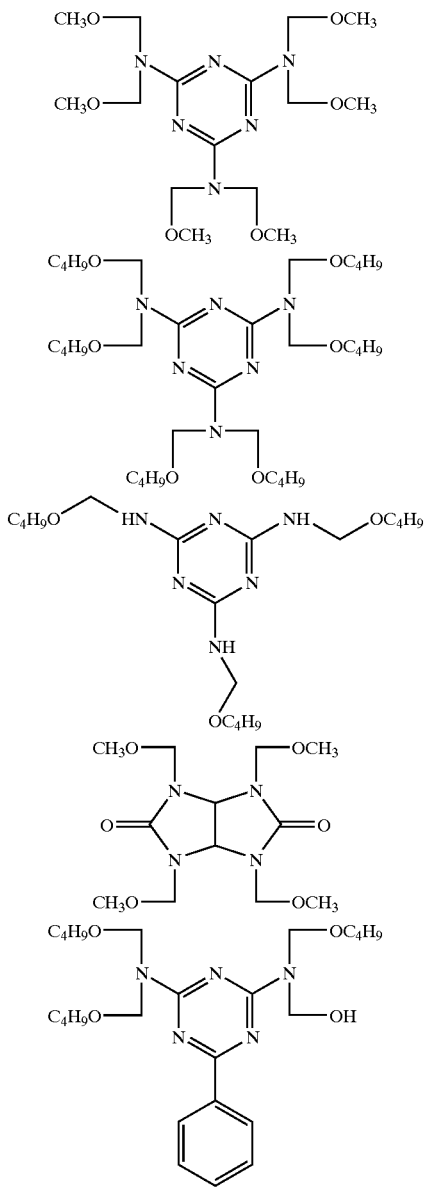

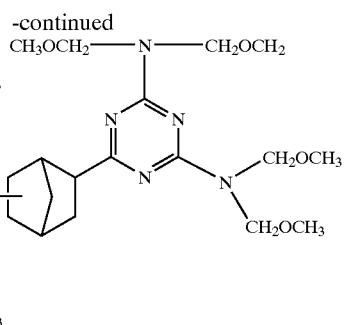

Materials having —N—(CH$_2$—OR)$_n$ units are available commercially from Cytec Industries, and Solutia as the Cymel, Powderlink, and Resimene series of products.

The polybenzoxazole precursor polymer, the photoactive agent, and the crosslinker are dissolved in a solvent to prepare the negative working, photosensitive composition of this invention. The solvent should not interfere with the photoacid generation from PAG or with the acid-catalyzed crosslinking reaction, should dissolve all components and should cast a good film. Suitable solvents include, but are not limited to, polar organic solvents, such as gamma-butyrolactone (GBL), propylene glycol methyl ether acetate (PGMEA), methoxy ethyl ether and mixtures thereof. The preferred solvent is gamma-butyrolactone.

The amount of polybenzoxazole precursor polymer (I) in the photosensitive composition of the present invention can range from about 10 wt % to about 50 wt % of total formulation. In a preferred embodiment, the content of (I) is from about 25 wt % to about 40 wt %. In a more preferred embodiment, the content of (I) is from about 25 wt % to about 35 wt % of total formulation.

The amount of PAG in the photosensitive composition of the present invention ranges from about 0.5 to 20 wt % based on amount of the polybenzoxazole precursor polymer. A preferred concentration range of PAG is from about 2 to about 15 wt % based on the amount of polybenzoxazole precursor polymer. The amount of optional sensitizer can be from about 0.1 to about 5 wt % based on the amount of polybenzoxazole precursor polymer.

The amount of latent crosslinker in the photosensitive composition of the present invention can be between about 2 to about 35 wt % based on amount of polybenzoxazole precursor polymer. A preferred amount of crosslinker is from about 5 to about 25 wt % based on the amount of polybenzoxazole precursor polymer.

The amount of solvent in the formulation of the photosensitive composition of the invention can be from about 45 wt % to about 87 wt % of the total weight. A preferred amount is from about 50 to about 65 wt % of the total formulation.

Optionally, an adhesion promoter may be included in the photosensitive composition. For stable photosensitive compositions, care must be taken to select a suitable adhesion promoter. Some adhesion promoters will cause the composition to darken or gel. This may be dependent on the reactivity of the crosslinker or PAG employed in the formulation. Generally, low basicity alkoxysilanes, such as N-derivatized aminoalkyl alkoxysilanes, are suitable. If employed, the amount of adhesion promoter ranges from about 0.1 wt. % to about 2 wt. % of the total formulation. A preferred amount of adhesion promoter is from about 0.2 wt. % to about 1.5 wt. % of the total formulation. A more preferred amount of adhesion promoter is from about 0.3 wt. % to about 1 wt. % of the total formulation.

The photosensitive compositions of the present invention may further include other additives. Suitable additives include, for example, leveling agents, dissolution inhibitors and the like. Such additives may be included in the photosensitive compositions in about 0.1–10 wt % of the sum of the weights of photoactive compounds and polybenzoxazole precursor polymer I.

In addition, the present invention includes a process for forming a negative tone relief image. The process comprises the steps of:

(a) providing a substrate, (b) coating on said substrate, a negative-working photosensitive composition comprising one or more polybenzoxazole precursors having the structure (I),

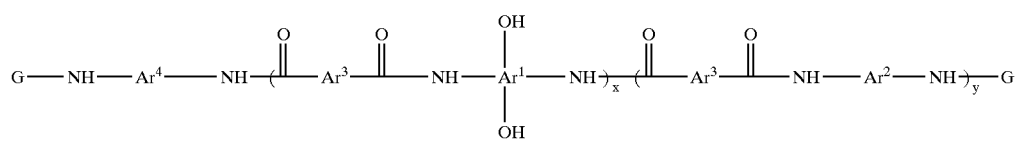

(I)

wherein $Ar^1$, $Ar^2$, $Ar^3$, and G are as defined above; one or more photo-active compounds which release acid upon irradiation, a latent crosslinker which contains at least two $\sim N-(CH_2OR)_n$ units wherein n=1 or 2 and R is a linear or branched $C_1$-$C_8$ alkyl group, with the proviso that when a glycoluril is employed as the latent crosslinker, the G group of the polybenzoxazole precursor polymer is produced from the reaction of a cyclic anhydride; and at least one solvent that is not NMP, thereby forming a coated substrate;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

To ensure proper adhesion of the photosensitive composition to the substrate the substrate may be optionally treated with an (external) adhesion promoter before the first coating step or the photosensitive composition may employ an internal adhesion promoter. Any suitable method of treatment of the substrate with adhesion promoter known to those skilled in the art may be employed. Examples include treatment of the substrate with adhesion promoter vapors, solutions, or at 100% concentration. The time and temperature of treatment will depend on the particular substrate, adhesion promoter, and method, which may employ elevated temperatures. Any suitable external adhesion promoter may be employed. Classes of suitable external adhesion promoters include but are not limited to vinylalkoxysilanes, methacryloxalkoxyysilanes, mercaptoalkoxysilanes, aminoalkoxysilanes, epoxyalkoxysilanes and glycidoxyalkoxysilanes. Aminosilanes and glycidoxysilanes are more preferred. Primary aminoalkoxysilanes are most preferred. Examples of suitable external adhesion promoters include, but are not limited to gamma-aminopropyltrimethoxysilane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane. gamma-Aminopropyltrimethoxysilane is more preferred. Additional suitable adhesion promoters are described in "Silane Coupling Agent" Edwin P. Plueddemann, 1982 Plenum Press, New York. The process may optionally include the step of post exposure baking the exposed coated substrate at an elevated temperature, prior to developing. Still another optional step is rinsing the developed substrate, prior to curing.

Examples of suitable substrates include, but are not limited to, silicon wafers, compound semiconductor (III–V) or (II–VI) wafers, glass, quartz or ceramic substrates, or the like. Coating methods include, but are not limited to, spray coating, spin coating, offset printing, roller coating, screen printing, extrusion coating, meniscus coating, curtain coating, and immersion coating. The resulting film is optionally prebaked at an elevated temperature. The bake may be completed at one or more temperatures within the temperature bake of from about 70° C. to about 150° C. for several minutes to half an hour, depending on the method, to evaporate the remaining solvent. Any suitable baking means may be employed. Examples of suitable baking means include, but are not limited to, hot plates and convection ovens.

Subsequently, the resulting film is exposed to actinic rays in a preferred pattern through a mask. X-rays, electron beam, ultraviolet rays, visible light, and the like can be used as actinic rays. The most preferable rays are those with wavelength of 436 nm (g-line) and 365 nm (i-line).

Following exposure to actinic radiation, the exposed and coated substrate is heated to a temperature between about 70° C. and 150° C. The exposed and coated substrate is heated in this temperature range for a short period of time, typically several seconds to several minutes and may be carried out using any suitable heating means. Preferred means include baking on a hot plate or in a convection oven. This process step is commonly referred to in the art as post exposure baking.

Next, the film is developed using an aqueous developer and a relief pattern is formed. The aqueous developer contains aqueous base. Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetramethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1% to about 5%. In addition, an appropriate amount of a surfactant can be added to the developer. Development can be carried out by means of immersion, spray, puddling, or other similar developing methods at temperatures from about 10° C. to 40° C. for about 30 seconds to about 5 minutes. After development, the relief pattern may be optionally rinsed using deionized water and dried by spinning, baking on a hot plate, in an oven, or other suitable means.

The benzoxazole ring is then formed by curing of the uncured relief pattern to obtain the final high heat resistant pattern. Curing is performed by baking the developed, uncured relief pattern at, or above, the glass transition temperature $T_g$ of the photosensitive composition to obtain the benzoxazole ring that provides high heat resistance. Typically, temperatures above about 200° C. are used. Preferably, temperatures from about 250° C. to about 400° C. are applied. The curing time is from about 15 minutes to about 24 hours depending on the particular heating method employed. A more preferred range for the curing time is from about 20 minutes to about 5 hours and the most preferred range of curing time is from about 30 minutes to about 3 hours. Curing can be done in air or preferably under a blanket of nitrogen and may be carried by any suitable heating means. Preferred means include baking on a hot plate or in a convection oven.

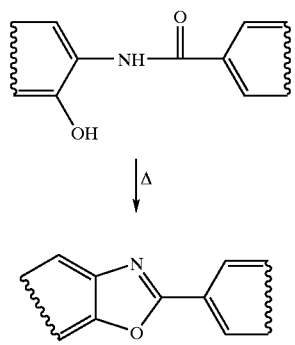

The application of the said polybenzoxazole relief images in semiconductor industry include, but are not limited to, stress relieve coatings for packaged semiconductors, alpha particle barrier films, interlevel dielectrics, insulating films and patterned engineering plastic layers. The examples of articles of commerce made using the disclosed formulation and method include, but not limited to memory devices, such as DRAMs, logic devices, such as microprocessors or microcontrollers, plating stencils, etc.

To illustrate the present invention, the following examples are provided. It should be understood that the present invention is not limited to the examples described.

SYNTHESIS EXAMPLE 1

Preparation of PBO Precursor with Amino End Groups (V)

To a 2 L, three-necked, round bottom flask equipped with a mechanical stirrer, nitrogen inlet and addition funnel, 155.9 g (426.0 mmol) of hexafluoro-2,2-bis(3-amino-4-hydroxyphenyl)propane, 64.3 g (794.9 mmol) of pyridine, and 637.5 g of N-methylpyrrolidone (NMP) were added. The solution was stirred at room temperature until all solids dissolved and then cooled in an ice water bath at 0–5° C. To this solution, 39.3 g (194 mmol) of isophthalyl chloride, and 56.9 g (194 mmol) of 1,4-oxydibenzoyl chloride dissolved in 427.5 g of NMP, were added drop-wise. After the addition was completed, the resulting mixture was stirred at room temperature for 18 hours. The viscous solution was precipitated in 10 liters of vigorously stirred de-ionized water. The polymer was collected by filtration and washed with de-ionized water and a water/methanol (50/50) mixture. The polymer was dried under vacuum conditions at 105° C. for 24 hours. The yield was almost quantitative and the inherent viscosity (IV) of the polymer was 0.20 dL/g measured in NMP at a concentration of 0.5 g/dL at 25° C.

The number average molecular weight (Mn) was determined by gel permeation chromatography using four Phenogel 10 columns with pore sizes of 104 Å, 500 Å, 100 Å and 50 Å and THF as an eluent. Polystyrene standards were used for calibration. The typical Mn for a polymer prepared by the above procedure was 5,800. The average molecular weight of the repeat unit is about 540, so the degree of polymerization (x+y, y=0) was determined to be about 11.

SYNTHESIS EXAMPLE 2

Synthesis of Polymer of Structure V with Alternative Monomer Ratio

To a 100 mL three-necked round bottom flask equipped with a mechanical stirrer, nitrogen inlet and addition funnel, 3.66 g (10 mmol) of hexafluoro-2,2-bis(3-amino-4-hydroxyphenyl)propane, 1.70 g (21 mmol) of pyridine and 15 g of N-methyl-2-pyrrolidone (NMP) were added. The solution was stirred at room temperature until all solids dissolved and then cooled in an ice water bath at 0–5° C. To this solution, 1.01 g (5 mmol) of isophthaloyl chloride and 1.477 g (5 mmol) of 1,4-oxydibenzoyl chloride dissolved in 10 g of NMP was added drop-wise. After the addition was completed, the resulting mixture was stirred at room temperature for 18 hours. The viscous solution was precipitated in 800 mL of vigorously stirred de-ionized water. The polymer was collected by filtration and washed with de-ionized water and a water/methanol (50/50) mixture. The polymer was dried under vacuum at 105° C. for 24 hours. The yield was almost quantitative and the inherent viscosity of the polymer was 0.36 dL/g measured in NMP at the concentration of 0.5 g/dL at 25° C.

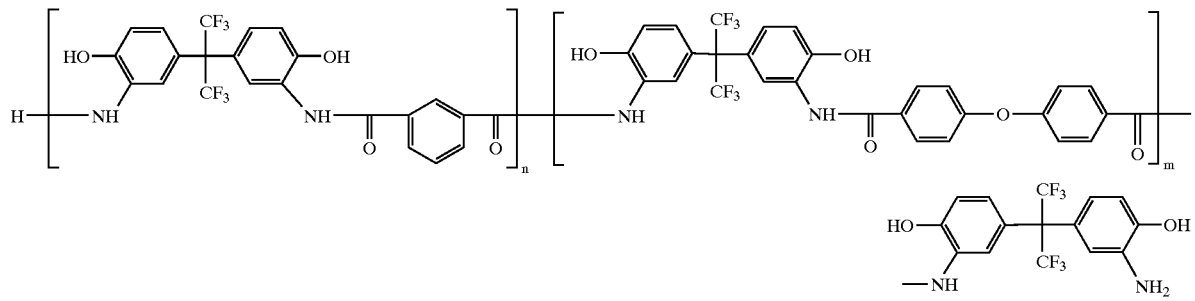

SYNTHETIC EXAMPLE 3

Preparation of a PBO Precursor with Acetyl End Groups (Ia)

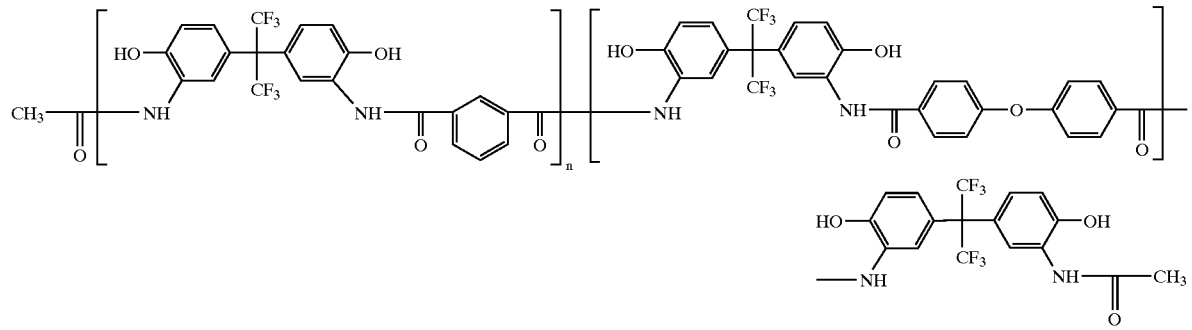

The PBO precursor obtained in Example 1 (100 g) was dissolved in 1000 g of Diglyme. Residual water was removed as an azeotrope with Diglyme using a rotary evaporator at 65° C. (10–12 torr). About 500 g of solvents was removed during the azeotropic distillation. The reaction solution was placed under a $N_2$ blanket, equipped with a magnetic stirrer and cooled using an ice bath down to about 5° C. Acetyl chloride (3.3 ml, 3.6 g) was added via syringe. The reaction was held on the ice bath for about 10 min. Then the ice bath was removed and the reaction was allowed to warm up over the period of 1 hr. Then, the mixture was again cooled to about 5° C. on the ice bath. Pyridine (3.7 ml, 3.6 g) was added via syringe over the period of 1 hr. The reaction was kept on the ice bath for about 10 min, and then was allowed to warm up over the period of 1 hr. The reaction mixture was then precipitated into 6 L of water with stirring.

The precipitated polymer was collected by filtration and air dried overnight. Then, the polymer was dissolved in 500–600 g of acetone and precipitated into 6 L of water/methanol (70/30). The polymer was again collected by filtration and air-dried for several hours. The still damp polymer cake was dissolved in a mixture of 700 g of THF and 70 ml of water in a bottle. An ion exchange resin UP604 (40 g), available from Rohm and Haas, was added and the bottle was rolled for 1 hr. The solution was suction filtered using a paper filter and a Buchner funnel to remove the UP604. The polymer was precipitated by adding the solution dropwise to 7 L of water. The slurry was filtered to recover the polymer, which was air-dried overnight and then dried for 24 hr in a vacuum oven at 90° C.

Yield: 100 g

SYNTHESIS EXAMPLE 4

Preparation of PBO Precursor End Capped with Nadic Anhydride (Ib)

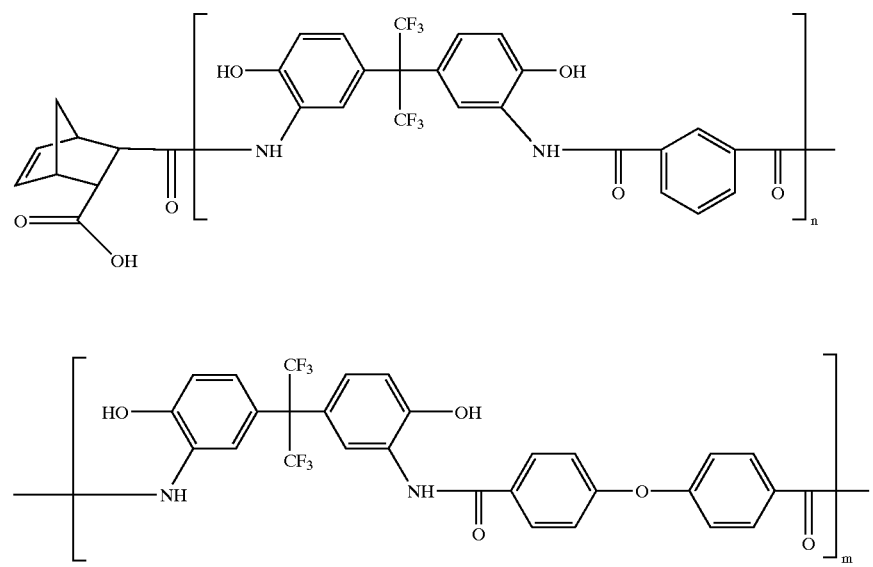

-continued

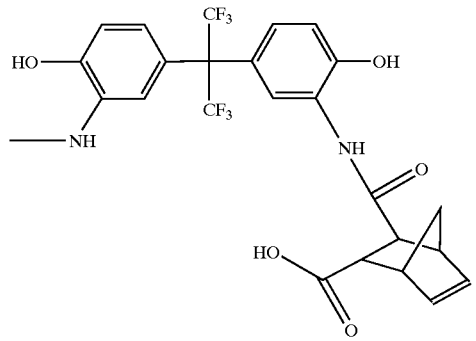

The PBO precursor obtained in Example 2 (200 g) was dissolved in a mixture of 600 g of Diglyme and 300 g of propylene glycol methyl ether acetate (PGMEA). Residual water was removed as an azeotrope with PGMEA and Diglyme using a rotary evaporator at 65° C. (10–12 torr). About 550 g of solvents was removed during the azeotropic distillation. The reaction solution was placed under a $N_2$ blanket and equipped with a magnetic stirrer. Nadic anhydride (7 g) was added followed by addition of 10 g of Pyridine. The reaction was stirred overnight at 50° C. Then the reaction mixture diluted with 500 g of tetrahydrofuran (THF) and precipitated into a mixture of 4 L of methanol with 4 L of water. The polymer was collected by filtration and vacuum dried at 80° C.

EXAMPLE 1

Formulation 1 was prepared by mixing together 100 parts by weight of the PBO precursor of Synthesis Example 3, 174 parts of GBL, 5 parts of (5-toluylsulfonyloxyimino-5H-thiophen-2-ylidene)-2-methylphenyl-acetonitrile (available from Ciba Specialty Chemicals), and 20 parts of a crosslinker Cymel 303 (hexamethoxymethylmelamine and its oligomers) available from Cytec Industries, which contains hexamethyl methoxy melamine as an active component. The formulation was filtered through a 1 μm filter.

Formulation 1 was spin coated onto a silicon wafer and baked on a hotplate for 3 minutes at 110° C. to obtain a photosensitive film of about 12 μm in thickness. This film was exposed on a Karl Suss broadband exposure tool using a variable transmission mask. The exposed, coated wafer was post exposure baked at 120° C. for 3 min, developed for 70 seconds using a 0.262N aqueous TMAH solution, and then rinsed with de-ionized water to provide a relief pattern. At the exposure dose of 200 mJ/cm², 10μ features were resolved with about 90% of the film thickness in the exposed area retained.

COMPARATIVE EXAMPLE 1

Comparative Formulation 1 was prepared by mixing together 100 parts by weight of the PBO precursor of Synthesis Example 1, 174 parts of GBL, 5 parts of (5-propylsulfonyloxyimino-5H-thiophen-2-ylidene)-2-methylphenyl-acetonitrile, and 20 parts of a crosslinker Cymel 303. The formulation was filtered through a 1 μm filter.

Comparative Formulation 1 was spin coated onto a silicon wafer and baked on a hotplate for 3 minutes at 110° C. to obtain a film of about 12 μm in thickness. This film was exposed on a Karl Suss broadband exposure tool using a variable transmission mask. The exposed, coated wafer was post exposure baked at 120° C. for 3 min, developed for 80 seconds using a 0.262N aqueous TMAH solution, and then rinsed with de-ionized water to provide a relief pattern. At the exposure dose of 400 mJ/cm², 50μ features were resolved with about 97% of the film thickness in the exposed area retained.

The results from Example 1 and Comparative Example 1 show that endcapped PBO precursor resins have faster photospeed and better resolution than uncapped PBO precursor resins.

EXAMPLE 2

Stability Studies of Formulation 1 and Comparative Formulation 1

The viscosities of Formulation 1 and Comparative Formulation 1 were measured using Cannon-Finske viscometer. The formulations were then placed in a 33° C. water bath. After 2 weeks, the formulations were cooled to 25° C. and formulation viscosities were measured again using Cannon-Finske viscometer. The viscosity change of Formulation 1 was only 33%. The viscosity change of Comparative Formulation 1 was so high that it formed gel. This example illustrates that capped PBO precursor resins have better formulation stability.

COMPARATIVE EXAMPLE 2

Comparative Formulation 2 was prepared by mixing together 100 parts by weight of the PBO precursor, prepared in the same way as in Synthesis Example 1, 160 parts of GBL, 5 parts of (5-toluylsulfonyloxyimino-5H-thiophen-2-ylidene)-2-methylphenyl-acetonitrile and 10 parts of a crosslinker Powderlink (tetrakis(methoxymethyl) glycoluril). The formulation was filtered through a 1 μm filter.

Comparative Formulation 2 was spin coated onto silicon wafers and baked on a hotplate for 3 minutes at 110° C. to obtain a film of about 10 μm in thickness. Then half of each wafer was flood exposed on a Karl Suss broadband exposure tool using a variable transmission mask. The exposed, coated wafers were baked again at 120° C. for 3 min. Then the wafers were immersed into a 0.262N aqueous TMAH solution. The dissolution rate was determined by dividing the film thickness by the time it took for exposed and unexposed part of the wafers to clear. There was no difference in dissolution rate in exposed and unexposed areas of the wafers. The dissolution rate in both cases was about 8 μ/min. This shows that crosslinking did not occur when using an uncapped PBO precursor resin to produce the solubility differential required to form images. In a similar

25 experiment, except using a 140° C. for 3 minute post exposure bake, no image formation was observed.

EXAMPLE 3

Formulation 2 was prepared by mixing together 100 parts by weight of the PBO precursor resin prepared in Synthesis Example 4, 160 parts of GBL, 5 parts of (5-toluylsulfonyloxyimino-5H-thiophen-2-ylidene)-2-methylphenyl-acetonitrile and 10 parts of a crosslinker Powderlink and 3 parts of tri(ethoxysilyl)propylethyl-carbamate. The formulation was filtered through a 0.2 μm filter.

Formulation 2 was spin coated onto a silicon wafer and baked on a hotplate for 4 minutes at 110° C. to obtain a film of about 8.6 μm in thickness. This film was exposed portion wise using incremental exposures on a Karl Suss broadband exposure took using a variable transmission mask. The coated, exposed wafer was then post exposure baked at 130° C. for 3 min, immersion developed for 210 seconds using 0.262N aqueous TMAH solution, and rinsed with de-ionized water to provide a relief pattern. At the exposure dose of 125 mJ/cm$^2$, 100% of the initial film were retained and 40μ features were resolved.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. A heat resistant negative working photosensitive composition that comprises (a) one or more polybenzoxazole precursor polymers (I):

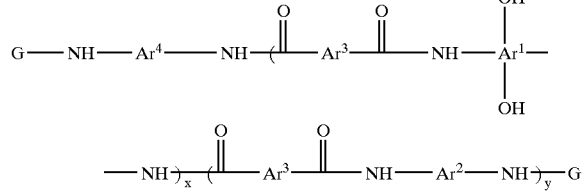

wherein x is an integer from about 10 to about 1000, y is an integer from 0 to about 900 and (x+y) is about less then 1000; $Ar^1$ is selected from the group consisting of a tetravalent aromatic group, a tetravalent heterocyclic group, or mixtures thereof; $Ar^2$ is selected from the group consisting a divalent aromatic, a divalent heterocyclic, a divalent alicyclic, a divalent aliphatic group that may contain silicon, or mixtures thereof; $Ar^3$ is selected from the group consisting a divalent aromatic group, a divalent aliphatic group, a divalent heterocyclic group, or mixtures thereof; $Ar^4$ is selected from the group consisting $Ar^1$ (OH)$_2$ or $Ar^2$; G is an organic group selected from the group consisting of groups having a carbonyl, carbonyloxy or sulfonyl group attached directly to the terminal NH group of the polymer;

(b) one or more photo-active compounds which release acid upon irradiation (PAGs);

(c) a latent crosslinker which contains at least two ~N—(CH$_2$OR)$_n$ units wherein n=1 or 2 and R is a linear or branched C$_1$–C$_8$ alkyl group, with the proviso that when a glycoluril is employed as the latent crosslinker,

26 the G group in the polybenzoxazole precursor polymer is produced from the reaction of a cyclic anhydride; and (d) at least one solvent that is not NMP.

2. A heat resistant negative working photoresist composition of claim 1, wherein $Ar^1$ is selected from the group consisting of the following structures:

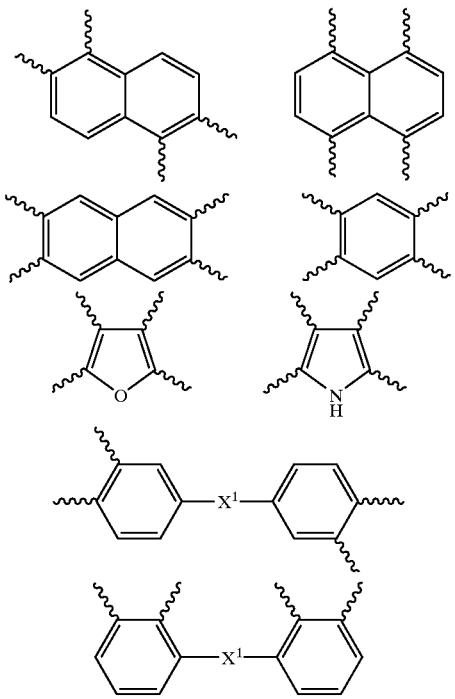

and mixtures thereof, wherein $X^1$ is selected from the group consisting of —O—, —S—, —C(CF$_3$)$_2$—, —CH$_2$—, —SO$_2$—, —NHCO— and —SiR$^1$$_2$— and each $R^1$ is independently selected from the group consisting of a C$_1$–C$_7$ linear or branched alkyl and a C$_5$–C$_8$ cycloalkyl group.

3. A heat resistant negative working photoresist composition of claim 1, wherein $Ar^1$ is a moiety derived from a reactant selected from the group consisting of 2,2-bis(3-amino-4-hydroxyphenyl)hexafluoropropane, 3,3'-dihydroxy-4,4'-diaminodiphenylether, 3,3'-dihydroxybenzidine, 4,6-diaminoresorcinol, and 2,2-bis(3-amino-4-hydroxyphenyl)propane.

4. A heat resistant negative working photoresist composition of claim 3, wherein $Ar^1$ is a moiety derived from the reactant 2,2-bis(3-amino-4-hydroxyphenyl) hexafluoropropane.

5. A heat resistant negative working photoresist composition of claim 1, wherein $Ar^3$ is selected from the group consisting of the following structures:

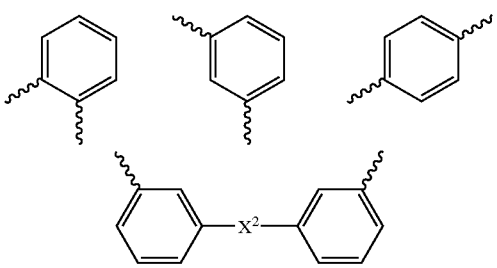

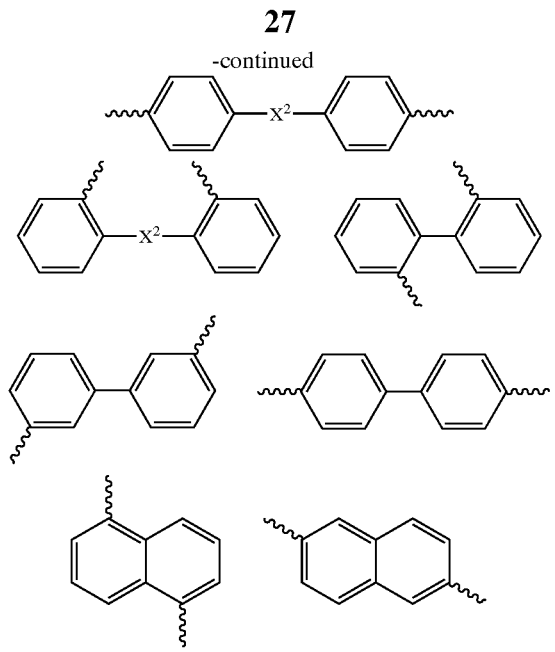

wherein $X^2$ is selected from the group consisting of —O—, —S—, —C(CF$_3$)$_2$—, —CH$_2$—, —SO$_2$—, —NHCO— and —SiR$^1_2$— and each R$^1$ is independently selected from the group consisting of a C$_1$–C$_7$ linear or branched alkyl and a C$_5$–C$_8$ cycloalkyl group —O—, —S—, —C(CF$_3$)$_2$—, —CH$_2$—, —SO$_2$—, and —NHCO—.

6. A heat resistant negative working photoresist composition of claim 1, wherein Ar$^3$ is a moiety derived from a reactant selected from the group consisting of: isophthaloyl dichloride, phthaloyl dichloride, terphthaloyl dichloride, 4,4'-diphenyletherdicarboxylic acid dichloride, 4,4'-diphenyletherdicarboxylic acid, terephthalic acid, isophthalic acid, dimethylisophthalate, dimethylphthalate, dimethylterphthalate, diethylisophthalate, diethylphthalate, diethylterphthalate, and mixtures thereof.

7. A heat resistant negative working photoresist composition of claim 1, wherein G is selected from the group consisting of the following structures:

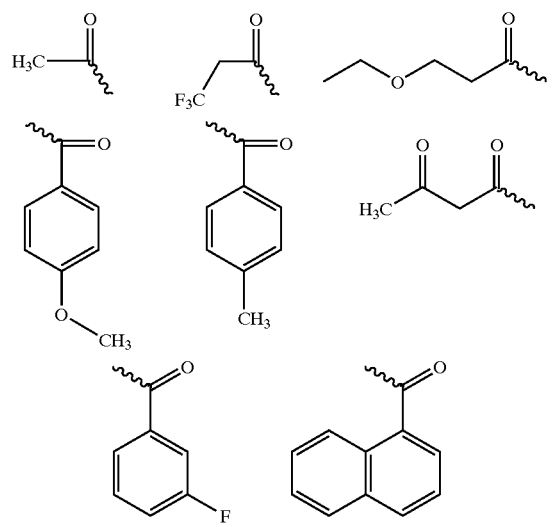

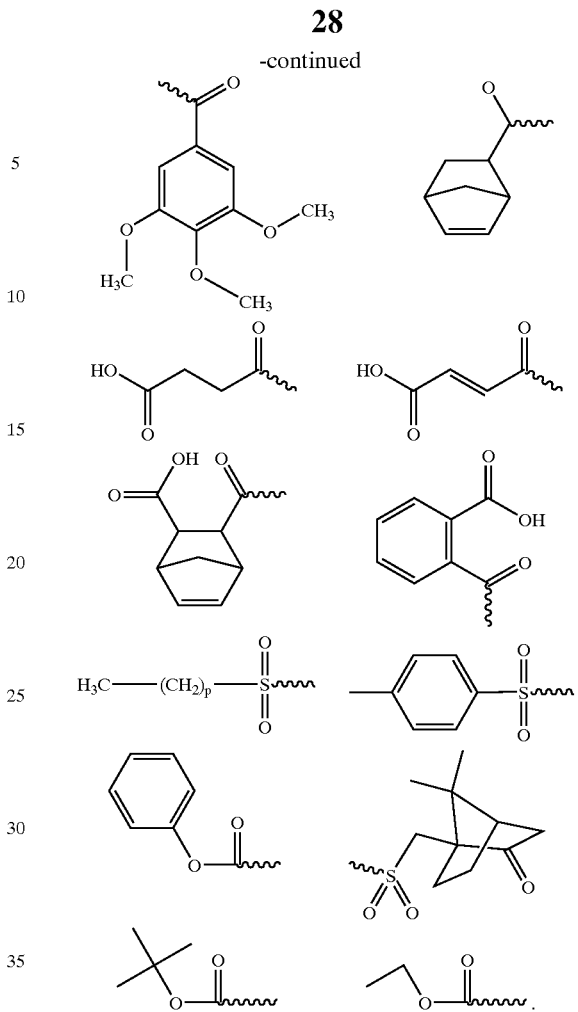

8. A heat resistant negative working photoresist composition of claim 1, wherein G is an organic group having a carbonyl attached directly to the terminal NH group of the polymer.

9. A heat resistant negative working photoresist composition of claim 1, wherein G is an alkyl carbonyl group or a carbonyl group derived from a cyclic anhydride.

10. A heat resistant negative working photoresist composition of claim 1, wherein the PAG is selected from the group consisting of oxime sulfonates, halomethyl triazides, diazoquinone sulfonates, and sulfonium or idonium salts of sulfonic acids.

11. A heat resistant negative working photoresist composition of claim 1, wherein the PAG is selected from the group consisting of oxime sulfonates and sulfonium or iodonium salts of sulfonic acids.

12. A heat resistant negative working photoresist composition of claim 1, wherein the latent crosslinker is selected from the group consisting of alkoxymethylmelamines, alkoxymethylglycolurils, alkoxymethylbenzoguanamines, alkoxymethyldiguanamines, and melamine or benzoguanamine polymers.

13. A heat resistant negative working photoresist composition of claim 1, wherein the latent crosslinker is selected from the group consisting of alkoxymethylmelamines and alkoxyamethylglycolurils.

14. A heat resistant negative working photoresist composition of claim 1, wherein the latent crosslinker is selected from the group consisting of

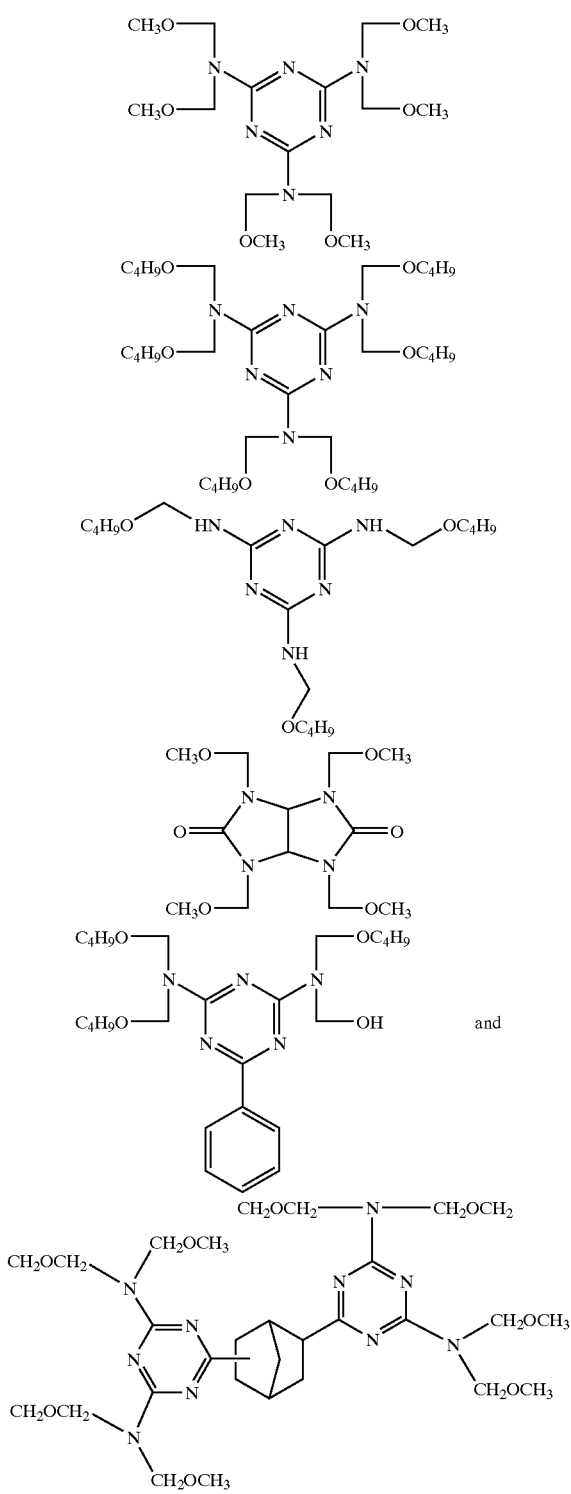

15. A heat resistant negative working photoresist composition of claim 1, wherein the solvent is selected from the group consisting of gamma-butyrolactone (GBL), propylene glycol methyl ether acetate, methoxy ethyl ether and mixtures thereof.

16. A heat resistant negative working photoresist composition of claim 15, wherein the solvent is gamma-butyrolactone.

17. A heat resistant negative working photoresist composition of claim 1, wherein the polybenzoxazole precursor polymer comprises from about 25 to about 35 wt % of the total composition, the PAG comprises from about 2 to about 15 wt % of the total composition, the latent crosslinker comprises from about 2 to about 35 wt % of the total composition, and the solvent comprises from about 45 to about 87 wt % of the total composition.

18. A heat resistant negative working photoresist composition of claim 1, wherein G is selected from the group consisting of an alkyl carbonyl and a carbonyl group derived from a cyclic anhydride, the latent crosslinker is selected from the group consisting of alkoxymethylmelamines and alkoxymethylglycolurils, and the PAG is selected from the group consisting of oxime sulfonates and sulfonium or idonium salts of sulfonic acids.

19. A heat resistant negative working photoresist composition of claim 1, wherein $Ar^1$ is a moiety derived from the reactant 2,2-bis(3-amino-4-hydroxyphenyl)hexafluoropropane, the solvent is gamma-butyrolactone, and the latent crosslinker is selected from the group consisting of alkoxymethylmelamines and alkoxyamethylglycolurils.

20. A heat resistant negative working photoresist composition of claim 1, wherein the latent crosslinker is an alkoxyamethylglycoluril, G is a carbonyl moiety derived a cyclic anhydride, and the PAG is selected from the group consisting of oxime sulfonates and sulfonium salts of sulfonic acids.

21. A heat resistant negative working photoresist composition of claim 1, additionally comprising an adhesion promoter.

22. A heat resistant negative working photoresist composition of claim 21, wherein the adhesion promoter is present in the composition in an amount of from about 0.1 to about 2 wt % of the total composition.

23. A heat resistant negative working photoresist composition of claim 21, wherein the adhesion promoter is an N-derivatized aminoalkyl alkoxysilane.

24. A process for forming a patterned image on a substrate, the process comprises the steps of:
(a) providing a substrate;
(b) coating on said substrate a negative-working photosensitive composition of claim 1;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

25. A process for forming a patterned image on a substrate, the process comprises the steps of:
(a) providing a substrate;
(b) coating on said substrate a negative-working photosensitive composition of claim 2;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

26. A process for forming a patterned image on a substrate, the process comprises the steps of:
(a) providing a substrate;

(b) coating on said substrate a negative-working photosensitive composition of claim 3;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

27. A process for forming a patterned image on a substrate, the process comprises the steps of:
(a) providing a substrate;
(b) coating on said substrate a negative-working photosensitive composition of claim 4;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

28. A process for forming a patterned image on a substrate, the process comprises the steps of:
(a) providing a substrate;
(b) coating on said substrate a negative-working photosensitive composition of claim 5;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

29. A process for forming a patterned image on a substrate, the process comprises the steps of:
(a) providing a substrate;
(b) coating on said substrate a negative-working photosensitive composition of claim 6;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

30. A process for forming a patterned image on a substrate, the process comprises the steps of:
(a) providing a substrate;
(b) coating on said substrate a negative-working photosensitive composition of claim 7;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

31. A process for forming a patterned image on a substrate, the process comprises the steps of:
(a) providing a substrate;
(b) coating on said substrate a negative-working photosensitive composition of claim 8;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

32. A process for forming a patterned image on a substrate, the process comprises the steps of:
(a) providing a substrate;
(b) coating on said substrate a negative-working photosensitive composition of claim 9;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

33. A process for forming a patterned image on a substrate, the process comprises the steps of:
(a) providing a substrate;
(b) coating on said substrate a negative-working photosensitive composition of claim 10
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

34. A process for forming a patterned image on a substrate, the process comprises the steps of:
(a) providing a substrate;
(b) coating on said substrate a negative-working photosensitive composition of claim 11;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

35. A process for forming a patterned image on a substrate, the process comprises the steps of:
(a) providing a substrate;
(b) coating on said substrate a negative-working photosensitive composition of claim 12;
(c) exposing the coated substrate to actinic radiation;
(d) post exposure baking the coated substrate at an elevated temperature;
(e) developing the coated substrate with an aqueous developer, thereby forming a relief image; and
(f) baking the substrate at an elevated temperature, thereby curing the relief image.

36. A process for forming a patterned image on a substrate, the process comprises the steps of:
(a) providing a substrate;
(b) coating on said substrate a negative-working photosensitive composition of claim 13;
(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

37. A process for forming a patterned image on a substrate, the process comprises the steps of:

(a) providing a substrate;

(b) coating on said substrate a negative-working photosensitive composition of claim 14;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

38. A process for forming a patterned image on a substrate, the process comprises the steps of:

(a) providing a substrate;

(b) coating on said substrate a negative-working photosensitive composition of claim 15;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

39. A process for forming a patterned image on a substrate, the process comprises the steps of:

(a) providing a substrate;

(b) coating on said substrate a negative-working photosensitive composition of claim 16;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

40. A process for forming a patterned image on a substrate, the process comprises the steps of:

(a) providing a substrate;

(b) coating on said substrate a negative-working photosensitive composition of claim 17;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

41. A process for forming a patterned image on a substrate, the process comprises the steps of:

(a) providing a substrate;

(b) coating on said substrate a negative-working photosensitive composition of claim 18;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

42. A process for forming a patterned image on a substrate, the process comprises the steps of:

(a) providing a substrate;

(b) coating on said substrate a negative-working photosensitive composition of claim 19;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

43. A process for forming a patterned image on a substrate, the process comprises the steps of:

(a) providing a substrate;

(b) coating on said substrate a negative-working photosensitive composition of claim 20;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

44. A process for forming a patterned image on a substrate, the process comprises the steps of:

(a) providing a substrate;

(b) coating on said substrate a negative-working photosensitive composition of claim 21;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

45. A process for forming a patterned image on a substrate, the process comprises the steps of:

(a) providing a substrate;

(b) coating on said substrate a negative-working photosensitive composition of claim 22;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

46. A process for forming a patterned image on a substrate, the process comprises the steps of:

(a) providing a substrate;

(b) coating on said substrate a negative-working photosensitive composition of claim 23;

(c) exposing the coated substrate to actinic radiation;

(d) post exposure baking the coated substrate at an elevated temperature;

(e) developing the coated substrate with an aqueous developer, thereby forming a relief image; and (f) baking the substrate at an elevated temperature, thereby curing the relief image.

47. A process according to claim 24, wherein the substrate to be coated with the negative-working photoresist composition in step (a) is a substrate that has been treated with an external adhesion promoter.

48. A process according to claim 47 wherein the external adhesion promoter is selected from the group consisting of vinylalkoxysilanes, methacryloxalkoxyysilanes, mercaptoalkoxysilanes, aminoalkoxysilanes, epoxyalkoxysilanes and glycidoxyalkoxysilanes.

49. A process according to claim 48 wherein the external adhesion promoter is selected from the group consisting of gamma-aminopropyltrimethoxysilane, gamma-glycidoxypropylmethyldimethoxysilane, gamma-glycidoxypropylmethyldiethoxysilane, gamma-mercaptopropylmethyldimethoxysilane, 3-methacryloxypropyldimethoxymethylsilane, and 3-methacryloxypropyltrimethoxysilane.

50. A process according to claim 49 wherein the external adhesion promoter is gamma-aminopropyltrimethoxysilane.

51. A substrate having a patterned image produced by the process of claim 24.

52. A substrate having a patterned image produced by the process of claim 41.

53. A substrate having a patterned image produced by the process of claim 42.

54. A substrate having a patterned image produced by the process of claim 43.

55. A substrate having a patterned image produced by the process of claim 44.

56. A substrate having a patterned image produced by the process of claim 45.

57. A substrate having a patterned image produced by the process of claim 46.

58. A substrate having a patterned image produced by the process of claim 47.

59. A substrate having a patterned image produced by the process of claim 48.

60. A substrate having a patterned image produced by the process of claim 49.

61. A substrate having a patterned image produced by the process of claim 50.

* * * * *